(12) United States Patent
Sakano et al.

(10) Patent No.: US 7,329,957 B2
(45) Date of Patent: Feb. 12, 2008

(54) CIRCUIT DEVICE AND MANUFACTURING METHOD THEREOF

(75) Inventors: Jun Sakano, Gunma (JP); Kouji Takahashi, Gunma (JP); Yusuke Igarashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 354 days.

(21) Appl. No.: 11/085,287

(22) Filed: Mar. 21, 2005

(65) Prior Publication Data

US 2005/0214981 A1 Sep. 29, 2005

(30) Foreign Application Priority Data

Mar. 24, 2004 (JP) ............... P. 2004-086555

(51) Int. Cl.
- *H01L 23/31* (2006.01)
- *H01L 23/13* (2006.01)
- *H05K 1/00* (2006.01)
- *H05K 1/05* (2006.01)

(52) U.S. Cl. ............ 257/778; 257/708; 257/711

(58) Field of Classification Search ............ 257/778, 257/787, 708, 709, 710, 711, E23.116, E23.124, 257/E23.006; 438/108, 121, 124, 127, 118
See application file for complete search history.

(56) References Cited

U.S. PATENT DOCUMENTS

| | | | |
|---|---|---|---|
| 5,306,670 A * | 4/1994 | Mowatt et al. | 29/832 |
| 6,548,328 B1 * | 4/2003 | Sakamoto et al. | 438/121 |
| 6,706,547 B2 * | 3/2004 | Sakamoto et al. | 438/33 |
| 6,791,199 B2 * | 9/2004 | Sakamoto et al. | 257/787 |
| 6,967,401 B2 * | 11/2005 | Sakamoto et al. | 257/706 |
| 7,026,190 B2 * | 4/2006 | Kobayashi et al. | 438/114 |
| 2003/0011065 A1 * | 1/2003 | Sakamoto et al. | 257/710 |
| 2004/0006869 A1 | 1/2004 | Igarashi et al. | |
| 2005/0104198 A1 * | 5/2005 | Takahashi | 257/708 |
| 2005/0206014 A1 * | 9/2005 | Sakamoto et al. | 257/782 |
| 2007/0163992 A1 * | 7/2007 | Michalk et al. | 216/41 |
| 2007/0194441 A1 * | 8/2007 | Pavier | 257/708 |

FOREIGN PATENT DOCUMENTS

| | | | |
|---|---|---|---|
| EP | 1 143 509 A2 | * | 10/2001 |
| JP | 2002-110717 | | 4/2002 |
| JP | 2002-118214 | | 4/2002 |
| JP | 2002-280488 | | 9/2002 |
| JP | 2003-155591 | | 5/2003 |

* cited by examiner

*Primary Examiner*—M. Wilczewski
(74) *Attorney, Agent, or Firm*—Fish & Richardson P.C.

(57) ABSTRACT

A method of manufacturing a circuit device includes the steps of preparing a conductive foil, forming conductive patterns in convex shapes by forming an isolation trench on a surface of the conductive foil, covering the surface of the conductive foil with a resin film so as to form the resin film covering the isolation trench thicker than the resin film covering upper surfaces of the conductive patterns, exposing the upper surfaces of the conductive patterns out of the resin film by removing the resin film, electrically connecting the conductive pattern exposed out of the resin film to a circuit element, forming sealing resin to seal the circuit element, and removing a rear surface of the conductive foil until the conductive patterns are mutually isolated.

5 Claims, 14 Drawing Sheets

CIRCUIT DEVICE AND MANUFACTURING METHOD THEREOF

BACKGROUND OF THE INVENTION

Priority is claimed to Japanese Patent Application Number JP2004-086555 filed on Mar. 24, 2005, the disclosure of which is incorporated herein by reference in its entirety.

1. Field of the Invention

The present invention relates to a circuit device and a manufacturing method thereof and, more specifically, to a circuit device and a manufacturing method thereof which are capable of enhancing positional accuracy of an exposed part of a conductive pattern.

2. Background Art

Heretofore, there have been demands for the downsizing, the thinning, and the reduction in weight of circuit devices to be incorporated in electronic devices since the circuit devices have been adopted to cellular telephones, portable computers, and the like.

Taking a semiconductor device as an example for the circuit devices, a circuit device so-called a chip size package (CSP) having a size being equivalent to that of a chip has been recently developed.

However, a typical CSP applies a glass epoxy substrate as an interposer that precludes downsizing and achieving a thin profile of the CSP. To solve this problem, the applicant of the present invention has developed a method of manufacturing a circuit device as shown in FIG. 13A to FIG. 14C, in which a mounting substrate is not required. This technology is described for instance in Japanese Unexamined Patent Publication No. 2003-155591.

The method of manufacturing a circuit device will be described with reference to FIG. 13A to FIG. 14C. As shown in FIG. 13A, conductive foil 110 is prepared and etching resist 111 is patterned in a desired shape on a surface thereof. Next, as shown in FIG. 13B, isolation trenches 112 are formed on the surface of the conductive foil 110 by performing half etching. Then, as shown in FIG. 13C, resin film 115 is coated on the surface of the conductive foil after peeling off the etching resist 111. Next, as shown in FIG. 13D, open portions 130 are formed on the surfaces of conductive patterns 113. Such formation of the open portions 130 can be achieved by performing a removing method using a laser, a lithographic process, and the like. Here, errors upon formation of the open portions 130 are taken into account, and the peripheral portion of each of the open portions 130 and the peripheral portion of each of the conductive patterns 113 are separated from each other by providing a predetermined distance α.

As shown in FIG. 14A, sealing resin 120 is formed after a semiconductor element 116 and a chip element 117 are electrically connected to the conductive patterns 113. Subsequently, as shown in FIG. 14B, the respective conductive patterns 113 are electrically isolated by removing a rear surface of the conductive foil. Thereafter, as shown in FIG. 14C, external electrodes 121 are formed on rear surfaces of the conductive patterns 113 and then covering resin 122 is formed thereon. In the above-described process, it is possible to form a conventional circuit device.

However, the circuit device and the manufacturing method described above have the following problems.

As shown in FIG. 13D, the conductive patterns 113 have been formed in unnecessarily large planar sizes due to redundant design in consideration of errors upon formation of the open portions 130. Such redundant design has caused an increase in size of the entire circuit device. Moreover, a high-precision and expensive exposure machine or laser irradiator is required to form the open portion 130 in an accurate position. Such requirement has increased manufacturing costs.

Moreover, since an adhesive for attaching the chip element 117 or the like has been formed on the open portion 130 of the resin film, the adhesive has been formed into a constricted shape. Such a form has precluded reliability against thermal stress.

The present invention was made in view of the above-described problems, and a main objective thereof is to provide a circuit device and a manufacturing method thereof in which a positional accuracy for a conductive pattern is high with low cost.

SUMMARY OF THE INVENTION

The present invention provides a circuit device that includes conductive patterns, a circuit element electrically connected to the conductive pattern, a resin film being formed between the conductive patterns and covering side surfaces of the conductive patterns, an adhesive configured to fix the circuit element to the conductive patterns by contacting the upper surfaces and the side surfaces of the conductive patterns, and sealing resin for sealing the circuit element.

The present invention includes that, in the circuit device, the adhesive is any of a conductive adhesive and an insulative adhesive.

The present invention includes that, in the circuit device, a side surface of the adhesive is formed into a smoothly curved surface.

The present invention includes that, in the circuit device, the conductive patterns comprise a multilayer wiring structure.

The present invention includes that, in the circuit device, the circuit element is a semiconductor element to be mounted with a flip chip. The present invention further provides a method of manufacturing a circuit device that includes the steps of forming a conductive pattern, forming a resin film to cover the conductive patterns, exposing an upper surface of the conductive pattern out of the resin film, electrically connecting a circuit element to the conductive pattern through an adhesive, and covering the circuit element.

The present invention also provides a method of manufacturing a circuit device that includes the steps of preparing a conductive foil, forming conductive patterns in convex shapes by forming an isolation trench on a surface of the conductive foil, covering the surface of the conductive foil with a resin film so as to form the resin film covering the isolation trench thicker than the resin film covering upper surfaces of the conductive patterns, exposing the upper surfaces of the conductive patterns out of the resin film by removing the resin film, electrically connecting the conductive pattern exposed out of the resin film to a circuit element, forming sealing resin to seal the circuit element, and removing a rear surface of the conductive foil until the conductive patterns are mutually isolated.

The present invention includes that, in the method of manufacturing a circuit device, the upper surface of the conductive pattern is exposed out of the resin film by uniformly etching the resin film.

The present invention includes that, in the method of manufacturing a circuit device, the circuit element includes a semiconductor element to be mounted in a face-down manner.

The present invention includes that, in the method of manufacturing a circuit device, a rear surface of the conductive pattern constitutes an external electrode.

The present invention includes that, in the method of manufacturing a circuit device, the resin film is removed after subjecting the resin film to exposure.

The present invention includes that, in the method of manufacturing a circuit device, the resin film is formed by laminating the resin films in sheet shapes on the conductive film with a vacuum press.

The present invention includes that, in the method of manufacturing a circuit device, the resin film is formed by coating any of liquid resin and semisolid resin on a surface of the conductive foil.

The present invention includes that, in the method of manufacturing a circuit device, the resin film is removed until a side surface of the resin film is partially exposed.

According to the circuit device of the present invention, side surfaces of the adhesive can be formed into smoothly curved shapes. Therefore, it is possible to enhance reliability of this adhesive against thermal stress.

According to the method of manufacturing a circuit device of the present invention, it is possible to expose conductive patterns partially while curtailing formation of conventional exposed portions. Therefore, it is possible to remarkably enhance positional accuracy of the conductive patterns at the exposed portions. Moreover, it is possible to expose the conductive patterns partially without using an exposure machine or a laser irradiator. In this way, it is possible to reduce costs for manufacturing the circuit device.

DESCRIPTION OF THE PREFERRED EMBODIMENTS

First Embodiment

Figure 1A:
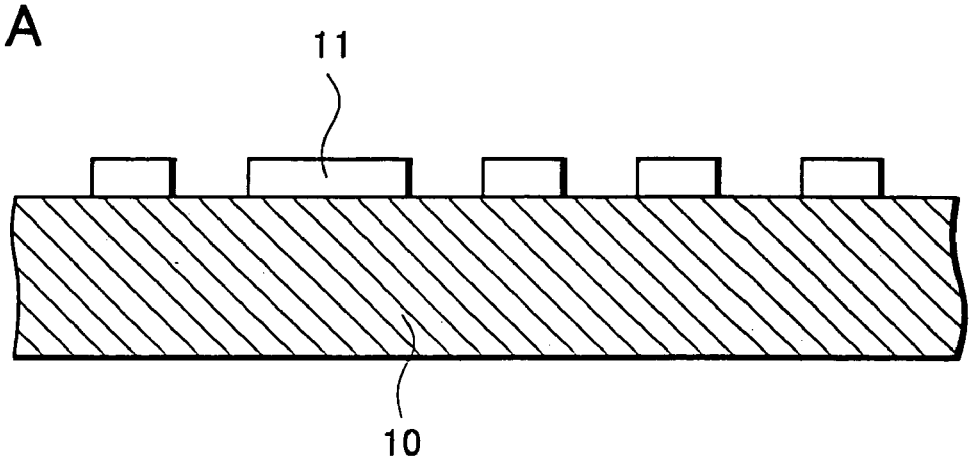
FIGS. 1A to 1C are cross-sectional views for describing a method of manufacturing a circuit device according to a first embodiment of the present invention.

A method of manufacturing a circuit device according to a first embodiment will be described with reference to FIG. 1A to FIG. 5C. The method of manufacturing a circuit device of this embodiment includes the steps of preparing conductive foil 10, forming conductive patterns 13 in convex shapes by forming isolation trenches 12 on a surface of the conductive foil 10, covering the surface of the conductive foil 10 with resin film 15 so as to form the resin film 15 covering the isolation trenches 12 thicker than the resin film 15 covering upper surfaces of the conductive patterns 13, exposing the upper surfaces of the conductive patterns 13 out of the resin film 15 by removing the resin film 15, electrically connecting the conductive patterns 13 exposed out of the resin film 15 to circuit elements, forming sealing resin 20 to seal the circuit elements, and removing a rear surface of the conductive foil 10 until the conductive patterns 13 are mutually isolated. In the following, a combination of semiconductor element 16 and chip element 17 is adopted as an example of the above-described circuit elements. Now, the respective steps will be described below in detail.

Figure 1B:
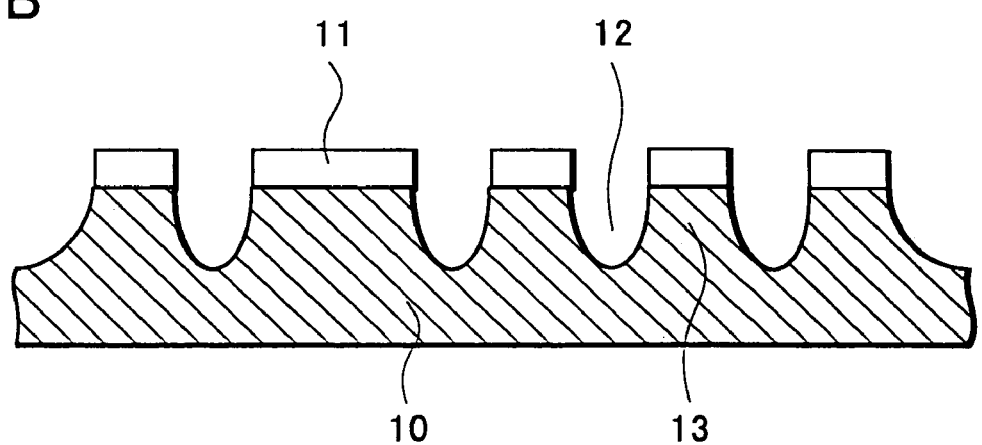
Figure 1C:
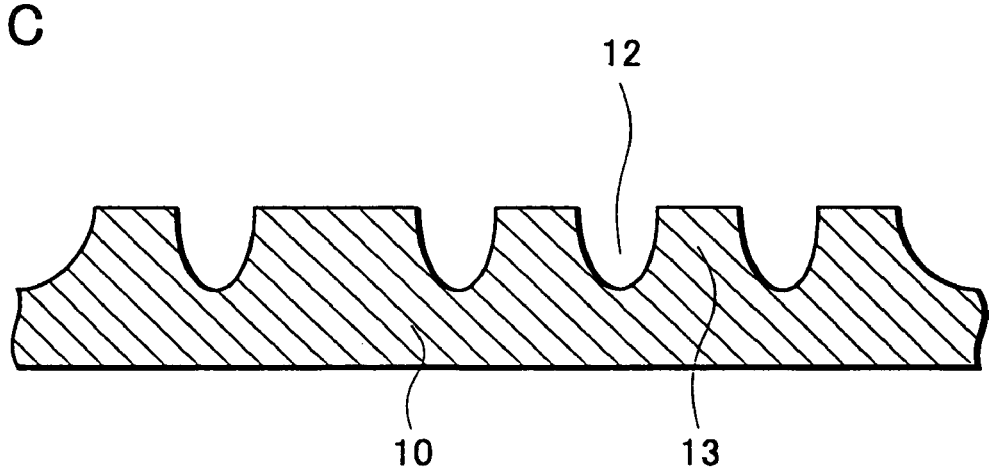

As shown in FIGS. 1A to 1C, a first process of this embodiment is intended to prepare the conductive foil 10 and to form the conductive patterns 13 into convex shapes by forming the isolation trenches 12 on the surface of the conductive foil 10.

In this process, the conductive foil 10 in a sheet shape is firstly prepared as shown in FIG. 1A. The material for this conductive foil 10 is selected in consideration of an adhesion property with a brazing member, a bonding property, and a plating property thereof. For example, a conductive foil using Cu as a main material, a conductive foil using Al as a main material, a conductive foil made of an alloy such as Fe—Ni, and the like are applied. The thickness of the conductive foil may be in the order of a range from 10 μm to 300 μm in consideration of an etching process to be performed later.

Subsequently, etching resist 11 which is an etching resistant mask is formed on a surface of the conductive foil 10. Then, the etching resist 11 is patterned so as to expose the conductive foil 10 in positions other than regions constituting the conductive patterns 13.

As shown in FIG. 1B, the isolation trenches 12 are formed by etching. The depth of the isolation trenches 12 formed by etching is equal to 50 μm, for example. As side surfaces of the isolation trenches 12 are formed into rough surfaces, an adhesion property with the sealing resin 20 or the resin film 15 in a later process will be enhanced. An etchant used herein may be typically ferric chloride or cupric chloride, and the conductive foil 10 is either dipped in or showered with this etchant. Here, wet etching generally provides non-anisotropic etching. Therefore, the side surfaces are formed into curved structures. Moreover, as shown in FIG. 1C, the etching resist 11 is peeled off and removed after completion of etching.

Figure 2A:
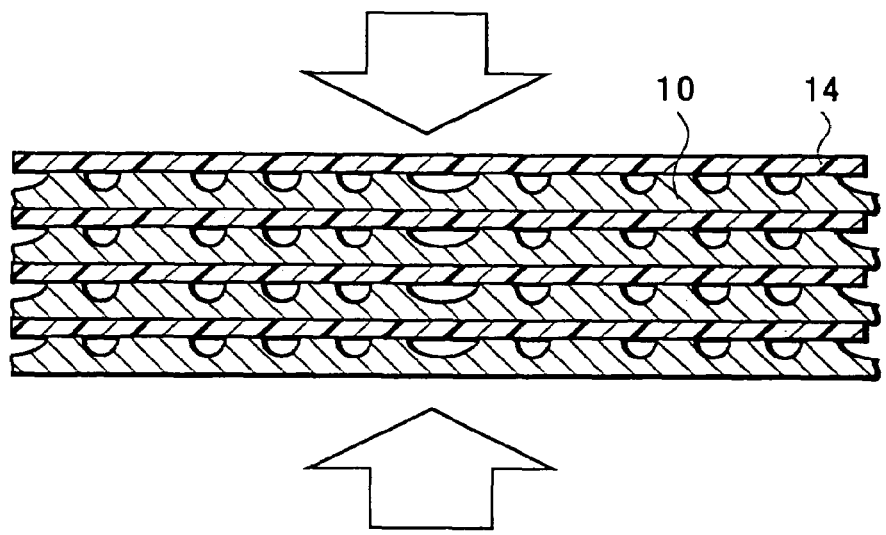
FIGS. 2A to 2C are more cross-sectional views for describing the method of manufacturing a circuit device according to the first embodiment of the present invention.
Figure 2B:
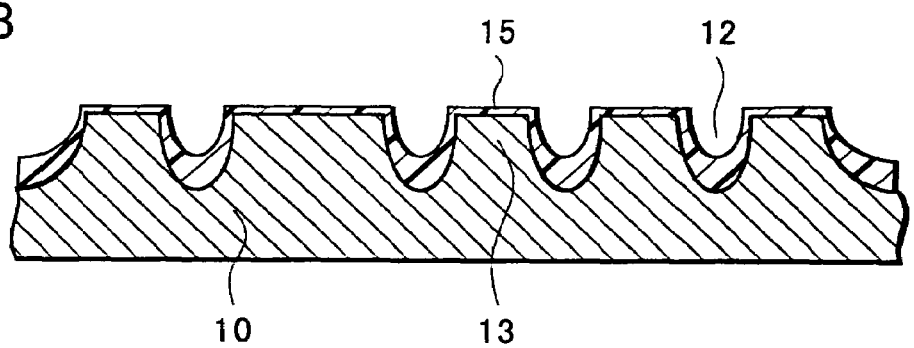
Figure 2C:
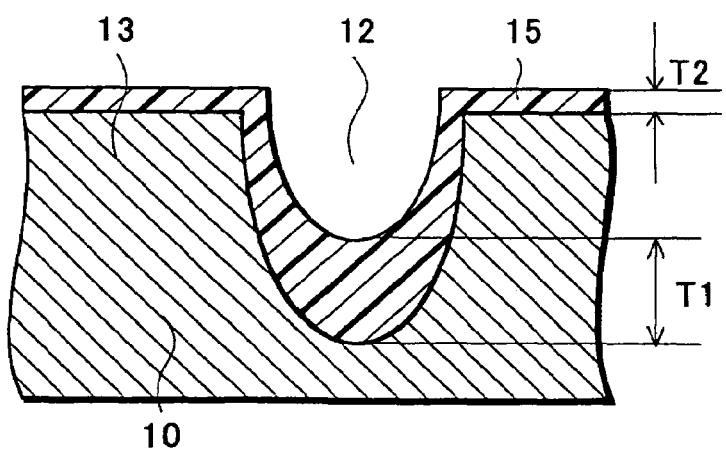

As shown in FIGS. 2A to 2C, a second process of this embodiment is intended to cover the surface of the conductive foil 10 with the resin film 15 so as to form the resin film 15 covering the isolation trenches 12 thicker than the resin film 15 covering the upper surfaces of the conductive patterns 13.

There may be two possible methods of forming the resin film 15 on the surface of the conductive foil 10. The first method is to form the resin film 15 by attaching a resin sheet 14 closely to the surface of the conductive foil 10. The second method is to form the resin film 15 by coating a liquid or semisolid resin material on the surface of the conductive foil 10 and then hardening the resin material. Although it is possible to form the resin film 15 by any of these methods, the method using the resin sheet 14 will be described herein.

As shown in FIG. 2A, the resin sheet 14 is attached to the surface of the conductive foil 10 by pressure. To be more precise, the conductive foils 10 and the resin sheets 14 alternately laminated are attached to one another by pressurization in the vertical direction. Such attachment may be also achieved by use of a vacuum press, which is configured to perform press under an almost vacuum atmosphere. Meanwhile, it is possible to harden or stabilize the resin by subjecting the resin film 15 to exposure or heating after completing formation thereof.

A cross section of the conductive foil 10 having the resin film 15 formed on the surface by the above-mentioned method will be described with reference FIG. 2B. Here, the substantially entire area of the surface of the conductive foil 10 including the isolation trenches 12 is covered with the resin film 15.

Details of the formed resin film 15 will be described with reference to FIG. 2C. The resin film 15 formed in the position of each of the isolation trenches 12 is formed thicker than the resin film 15 covering the upper surfaces of the conductive patterns 13. In addition, it is also possible to form the resin film 15 covering a lower part of the isolation trench 12 thicker than the resin film 15 covering an upper part of the isolation trench 12. It is possible form the thicker resin film 15 in the position of the isolation trench 12 as shown in the drawing either by the above-described method using the resin sheets 14 or by the method using the liquid resin material. In the method of forming the resin film 15 using the resin sheets 14, the resin material is concentrated on the positions of the isolation trenches 12 by pressurizing the resin sheets 14, whereby the resin film 15 covering the isolation trenches 12 are thickly formed. Meanwhile, in the method using the liquid resin material, the resin film 15 covering the isolation trenches 12 is thickly formed as the resin material is preferentially carried in the positions of the isolation trenches 12.

A third process of this embodiment is intended to expose the upper surfaces of the conductive patterns 13 out of the resin film 15 by removing the resin film 15.

Figure 3A:
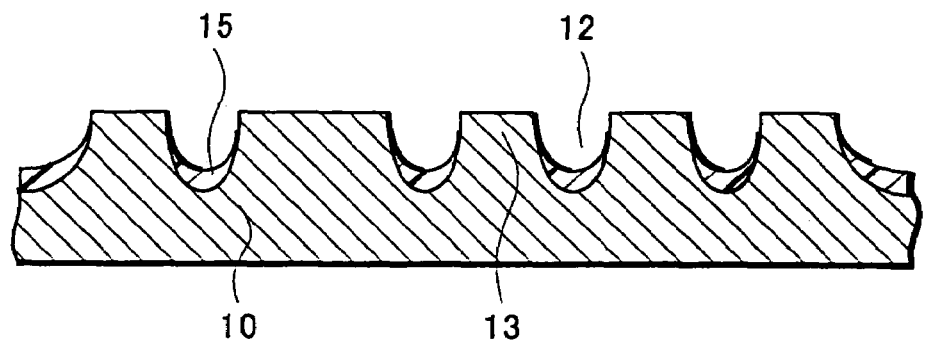
FIGS. 3A and 3B are more cross-sectional views for describing the method of manufacturing a circuit device according to the first embodiment of the present invention.

To be more precise, as shown in FIG. 3A, the upper surfaces of the conductive patterns 13 are exposed out of the resin film 15 by removing the substantially entire resin film 15 formed on the surface of the conductive foil 10. Here, the upper surfaces of the conductive patterns 13 are caused to be exposed out of the resin film 15 by etching the resin film 15 entirely instead of using a laser or lithographic process. As described previously, the resin film 15 covering the upper surfaces of the conductive patterns 13 is formed thinner than the resin film 15 covering the isolation trenches 12. Therefore, when the resin film 15 is etched uniformly without a mask, the upper surfaces of the conductive patterns 13 having the thinly formed resin film 15 thereon are preferentially exposed. In this embodiment, the etching process of the resin film 15 is stopped when the upper surfaces of the conductive patterns 13 are exposed. In this way, it is possible to expose the upper surface of the conductive patterns 13 out of the resin film 15 while leaving the resin film 15 in the regions of the isolation trenches 12. As an etchant for etching the resin film 15, a chemical agent which is reactive to the resin film 15 but not reactive to the material for the conductive foil 10 is adopted. To be more precise, it is possible to adopt a strong alkaline chemical as an etchant.

Figure 3B:
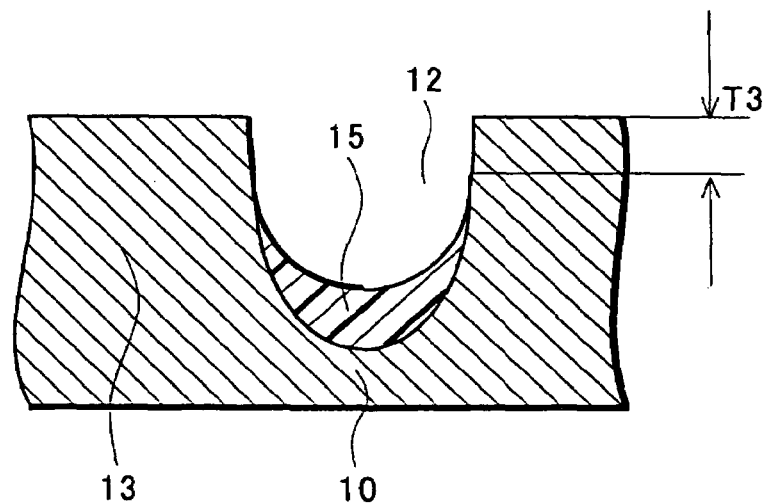

A cross-section after exposing the conductive patterns 13 will be described with reference to FIG. 3B. Upper side surfaces of the isolation trenches 12 along with the upper surfaces of the conductive patterns 13 may be also exposed out of the resin film 15 by etching the resin film 15. In this way, by performing the etching process until the upper side surfaces of the isolation trenches 12 are exposed out of the resin film 15, it is possible to ensure exposure of the upper surfaces of the conductive patterns 13 even in case of the uneven process of etching.

Figure 4A:
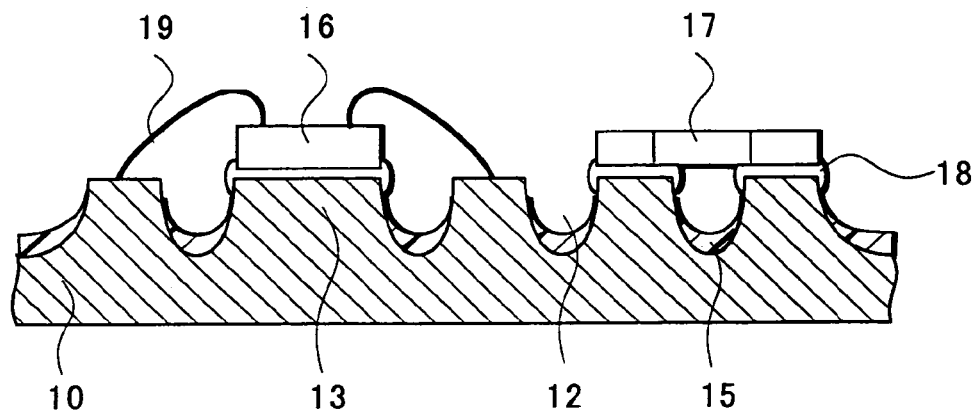
FIGS. 4A and 4B are more cross-sectional views for describing the method of manufacturing a circuit device according to the first embodiment of the present invention.
Figure 4B:
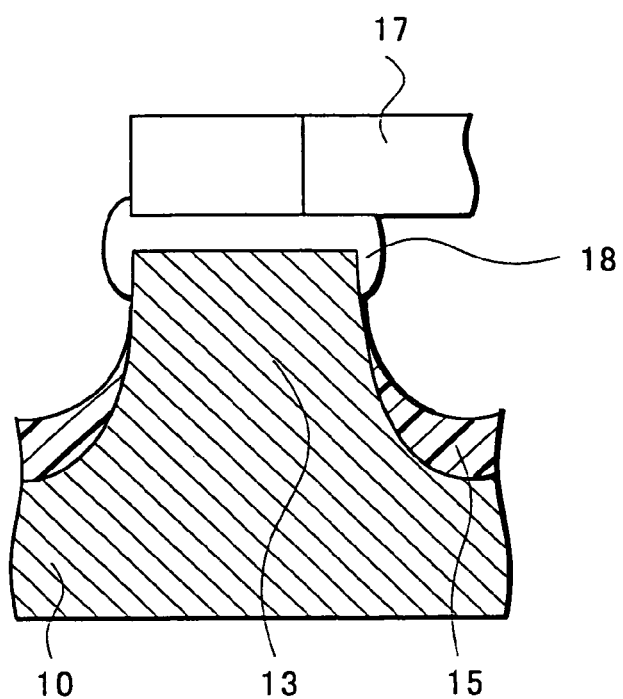

As shown in FIGS. 4A and 4B, a fourth process of this embodiment is intended to connect the conductive patterns 13 having been exposed out of the resin film electrically to the circuit elements.

As shown in FIG. 4A, the semiconductor element 16 and the chip element 17 are adopted as an example of the circuit elements. The semiconductor element 16 is fixed to the upper surface of the conductive pattern 13 through brazing member 18, and the semiconductor element 16 is electrically connected to the conductive patterns 13 through metal thin lines 19. Electrodes on both ends of the chip element 17 are fixed to the conductive patterns 13 through the brazing member 18. Here, passive elements and active elements are generally applicable as the circuit elements. Moreover, a resin sealing type package or CSP is applicable as the circuit element.

Figure 13A:
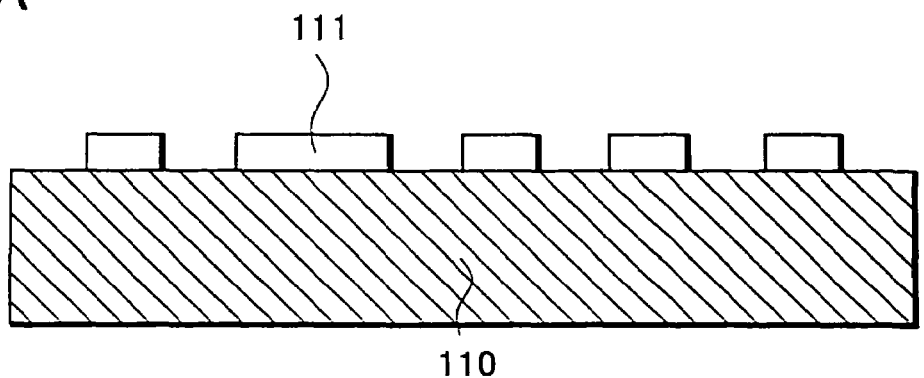
FIGS. 13A to 13D are cross-sectional views for describing a conventional method of manufacturing a circuit device.
Figure 13B:
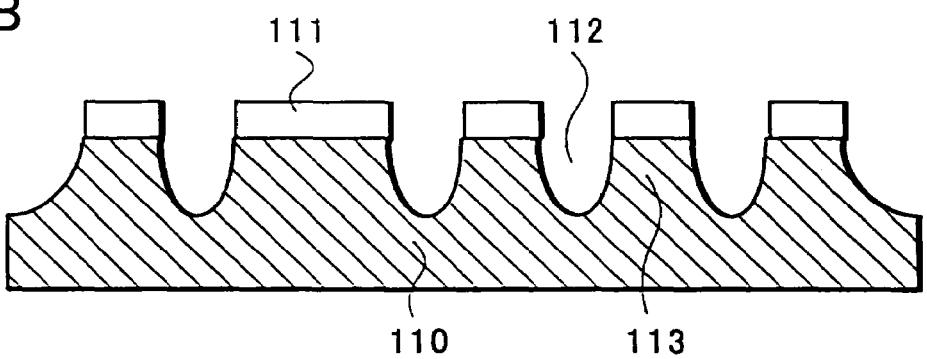
Figure 13C:
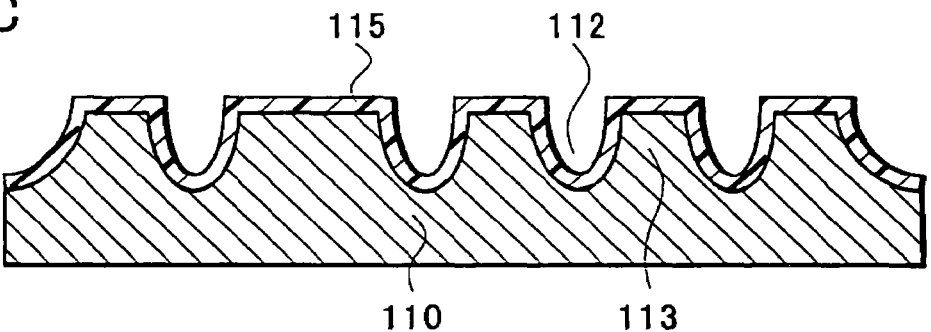
Figure 13D:
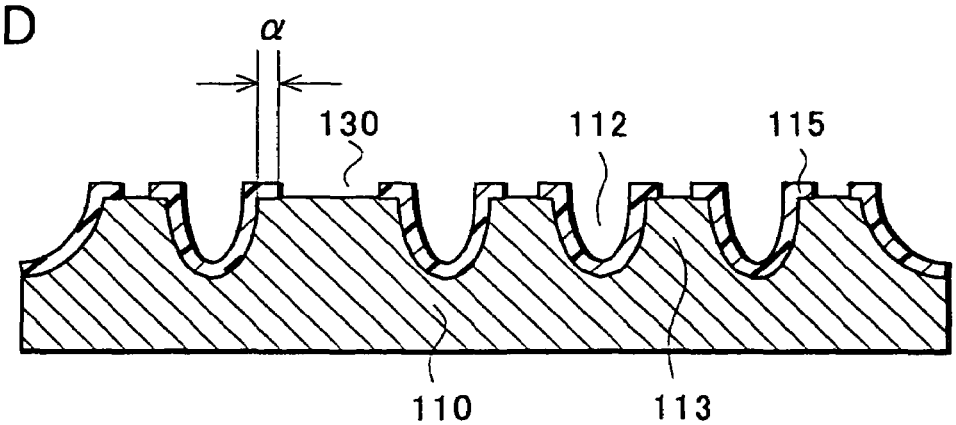
Figure 14A:
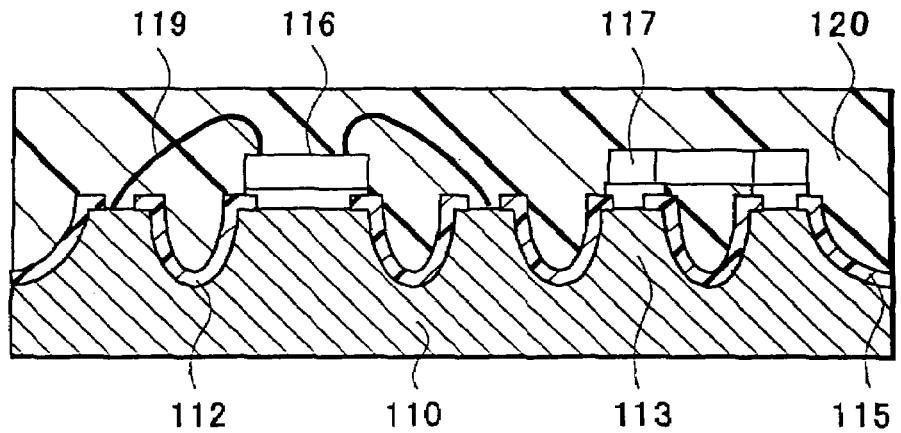
FIGS. 14A to 14C are more cross-sectional views for describing the conventional method of manufacturing a circuit device.
Figure 14B:
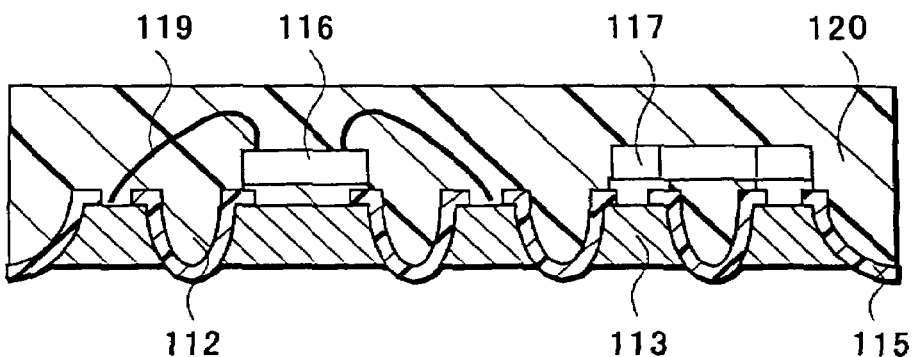
Figure 14C:
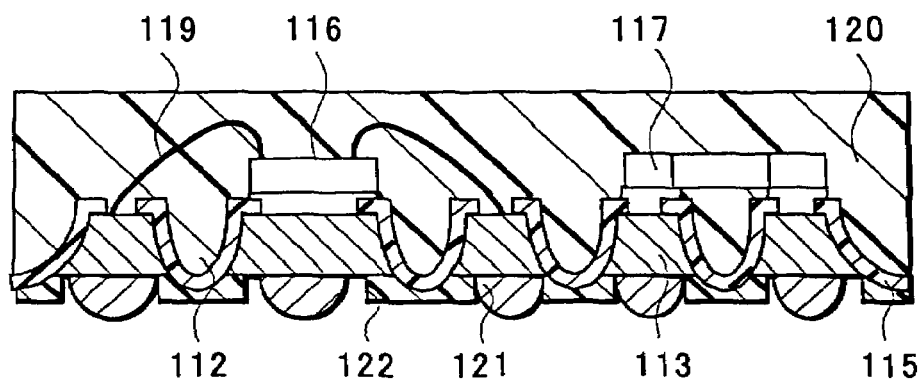

A mounting structure of the chip element 17 to be connected through the brazing member 18 will be described with reference to FIG. 4B. The brazing member 18 is formed so as to partially cover the upper surfaces and the side surfaces of the conductive patterns 13. Meanwhile, side surfaces of the brazing member 18 are continuously formed into smoothly curved faces. In comparison with the conventional example, the side surfaces of the brazing member 18 of this embodiment is formed into the smooth shapes because no bumps such as the open portions 130 as shown in FIG. 13B are formed therein. Since the side surfaces of the brazing member 18 are smoothly formed, it is possible to enhance strength of the brazing member 18 against thermal stress. In addition, since the isolation trenches 12 are covered with the resin film 15, it is possible to suppress a short circuit between the conductive patterns 13 attributable to excessive diffusion of the brazing member 18.

Figure 5A:
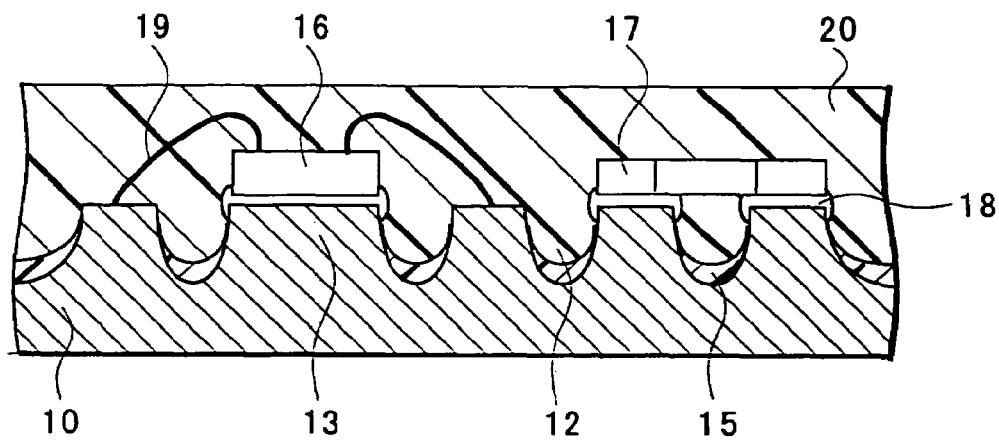
FIGS. 5A to 5C are more cross-sectional views for describing the method of manufacturing a circuit device according to the first embodiment of the present invention.
Figure 5B:
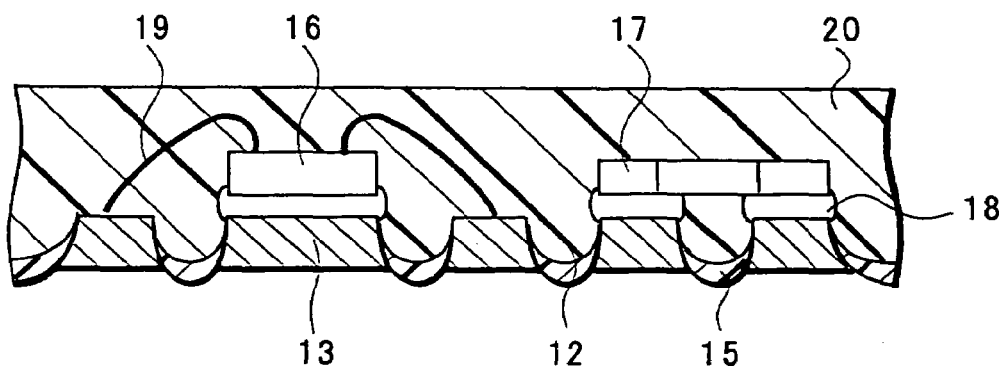
Figure 5C:
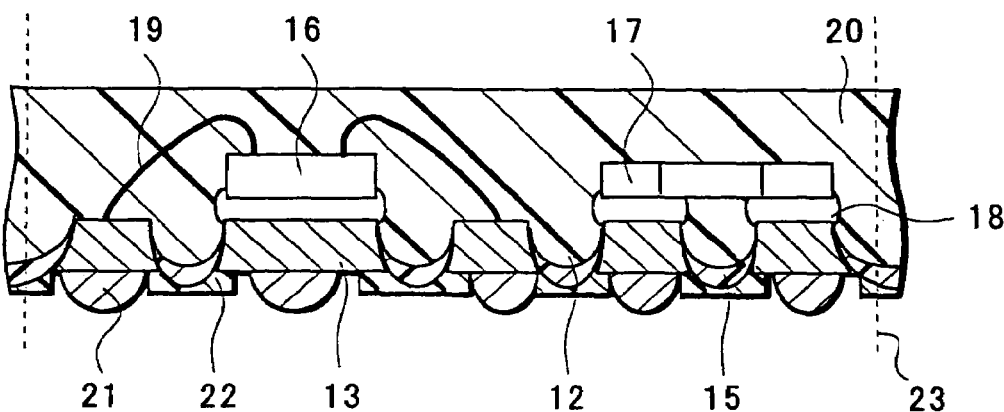

As shown in FIGS. 5A to 5C, a fifth process of this embodiment is intended to form the sealing resin 20 so as to seal the circuit elements and to remove the rear surface of the conductive foil 10 until the conductive patterns 13 are mutually isolated.

As shown in FIG. 5A, the sealing resin 20 covers the circuit elements and a plurality of conductive patterns 13, and the sealing resin 20 is filled in the isolation trenches 12 between the conductive patterns 13. Then, the conductive patterns 13 are supported by the sealing resin 20. This process can be achieved by transfer molding, injection molding or dipping. As the resin material, thermosetting resin such as epoxy resin is applicable to transfer molding while thermoplastic resin such as polyimide resin or polyphenylene sulfide is applicable to injection molding.

An advantage of this process is that the conductive foil 10 constituting the conductive pattern 13 serves as a supporting substrate until coating the sealing resin 20. Conventionally, conductive paths have been formed by use of a supporting substrate which was not actually essential. On the contrary, in this embodiment, the conductive foil 10 serving as the supporting substrate 10 is the essential material as the material for electrodes. Accordingly, the embodiment has advantages that it is possible to minimize constituent materials and to reduce costs.

As shown in FIG. 5B, the rear surface of the conductive foil 10 is removed until the sealing resin 20 filled in the isolation trenches 20 are exposed, thereby isolating the respective conductive patterns 13. This process is intended to remove the rear surface of the conductive foil 10 chemically and/or physically and thereby to isolate the respective conductive patterns 13. This process is achieved by polishing, grinding, etching, metal evaporation with a laser, and the like.

As shown in FIG. 5C, rear surfaces of the conductive patterns exposed out of the sealing resin 20 are covered with covering resin 22 and external electrodes 21 are formed in desired positions. Meanwhile, the respective circuit devices formed in a matrix are separated into individual pieces by cutting the sealing resin 20 along dicing lines 23 constituting boundaries of the respective circuit devices.

Second Embodiment

In this embodiment, a method of manufacturing a circuit device in the case of adopting a face-down semiconductor element as an embedded circuit element will be described with reference to FIG. 6A to FIG. 7C. Basic points of the method of manufacturing a circuit device of this embodiment are similar to the above-described first embodiment. Accordingly, description will be made below mainly on different points.

Figure 6A:
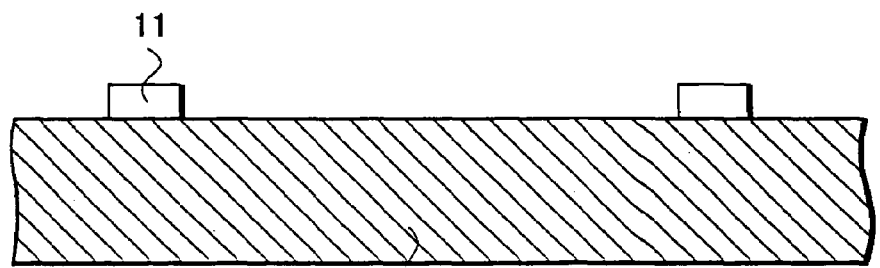
FIGS. 6A to 6D are cross-sectional views for describing a method of manufacturing a circuit device according to a second embodiment of the present invention.
Figure 6B:
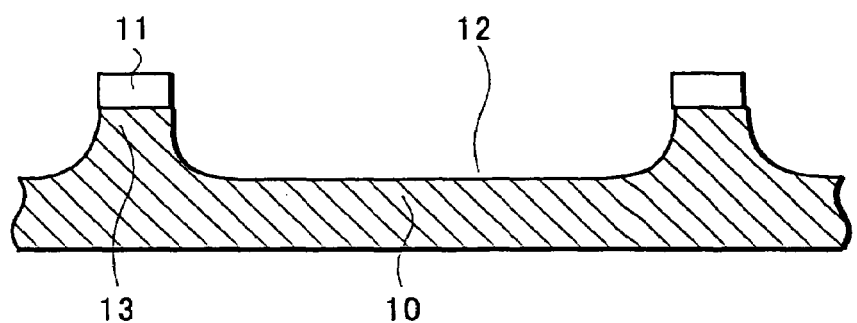

Firstly, as shown in FIG. 6A and FIG. 6B, conductive patterns 13 are formed into convex shapes by forming isolation trenches 12 on a surface of conductive foil 10. Here, the conductive patterns 13 are mainly formed for the purpose of connecting pads for an element to be disposed in a face-down manner. After completing formation of the isolation trenches 12, etching resist 11 is peeled off.

Figure 6C:
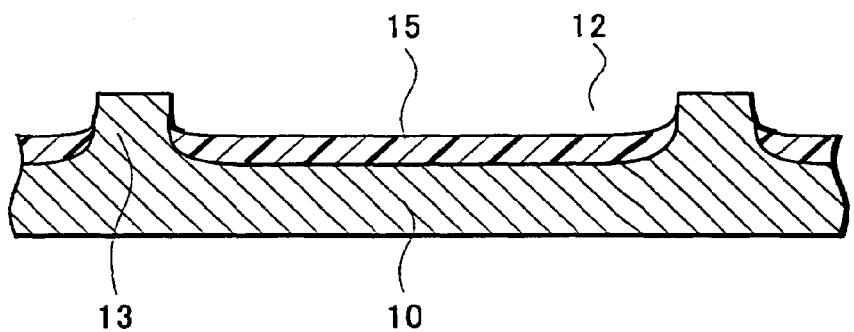

Next, as shown in FIG. 6C, resin film 15 is formed on the surface of the conductive foil 10, and then upper surfaces of the conductive patterns 13 are exposed out of the resin film 15 by etching the resin film 15. Details of this process are similar to the first embodiment.

Figure 6D:
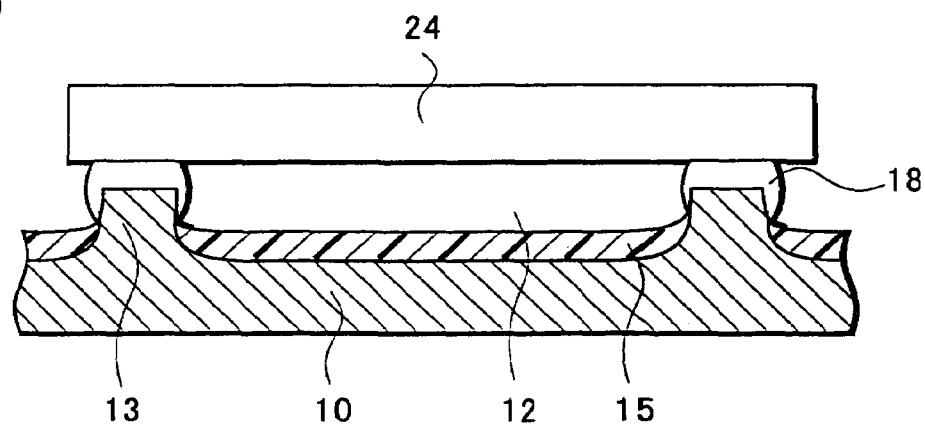
Figure 7A:
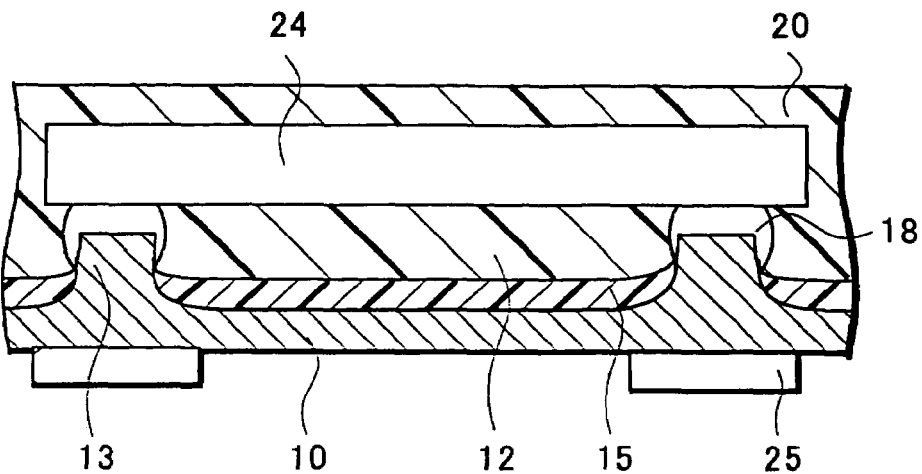
FIGS. 7A to 7C are more cross-sectional views for describing the method of manufacturing a circuit device according to the second embodiment of the present invention.

Next, as shown in FIG. 6D, semiconductor element 24 is disposed in a face-down manner. Electrodes of the semiconductor element 24 are electrically connected to the conductive patterns 13 through brazing member 18. Here, side surfaces of the brazing member 18 are also continuously formed into smoothly curved surfaces. Accordingly, the brazing member 18 has high strength against thermal stress. Moreover, as described previously, the conductive patterns 13 have very high positional accuracy. Therefore, the conductive patterns 13 can also deal with the semiconductor element 24 which has numerous fine-pitch terminals. After completing fixation of the semiconductor element 24, an underfill member made of resin may be filled below the semiconductor element 24. Furthermore, as shown in FIG. 7A, the semiconductor element 24 is covered with sealing member 20.

Figure 7B:
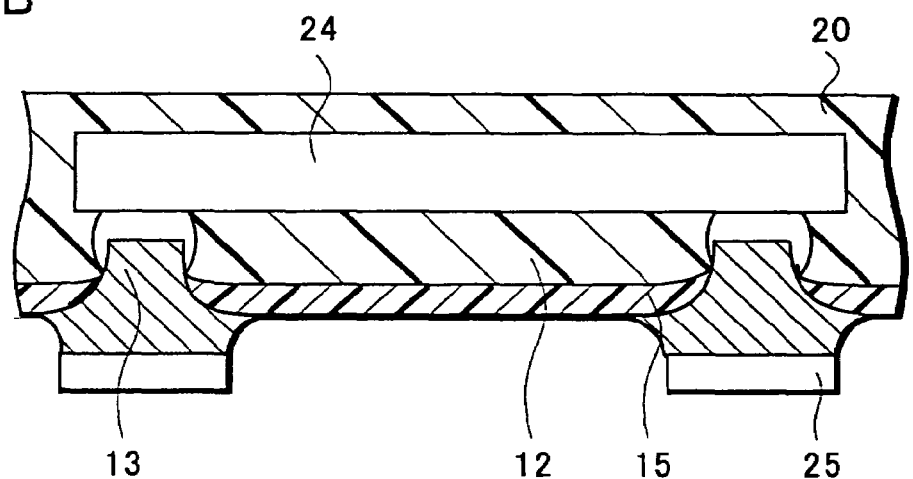

Next, as shown in FIG. 7B, a rear surface of the conductive foil 10 is removed until the respective conductive patterns 13 are mutually isolated. Here, the conductive foil 10 is subjected to selective etching after selectively forming etching resist 25 thereon. Exposed surfaces on the rear surfaces of the conductive patterns 13 to be isolated by etching in this process constitute electrodes to allow attachment of a brazing member to perform mounting of the circuit device. Therefore, an area of the lower surface of each of the conductive patterns 13 exposed out of the device is greater than an area of the upper surface thereof which is exposed out of the resin film 15.

Figure 7C:
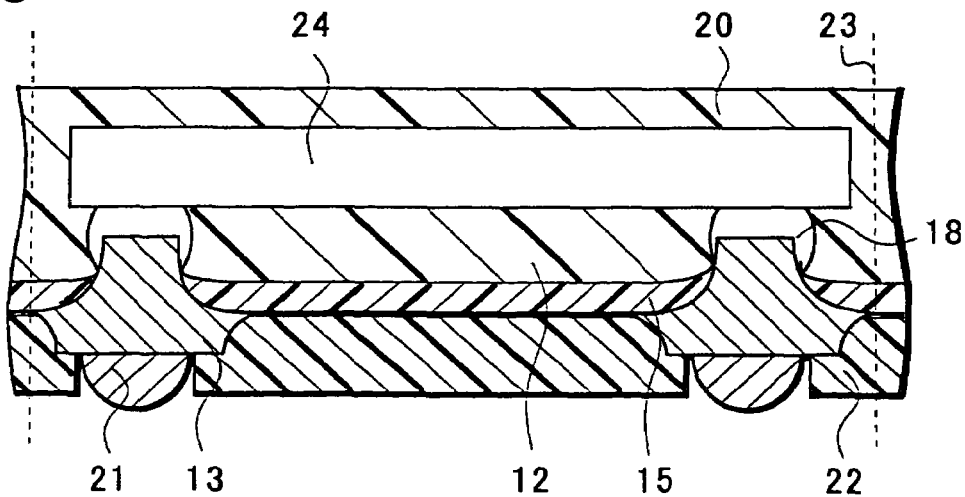

Next, as shown in FIG. 7C, the conductive patterns 13 exposed on the rear surface is partially covered with covering resin 22, and external, electrodes 21 made of a brazing member are formed on the rear surfaces of the conductive patterns 13. The circuit device 24 configured to embed the semiconductor element 24 in the face-down manner is manufactured by the above-described processes.

Third Embodiment

Figure 8A:
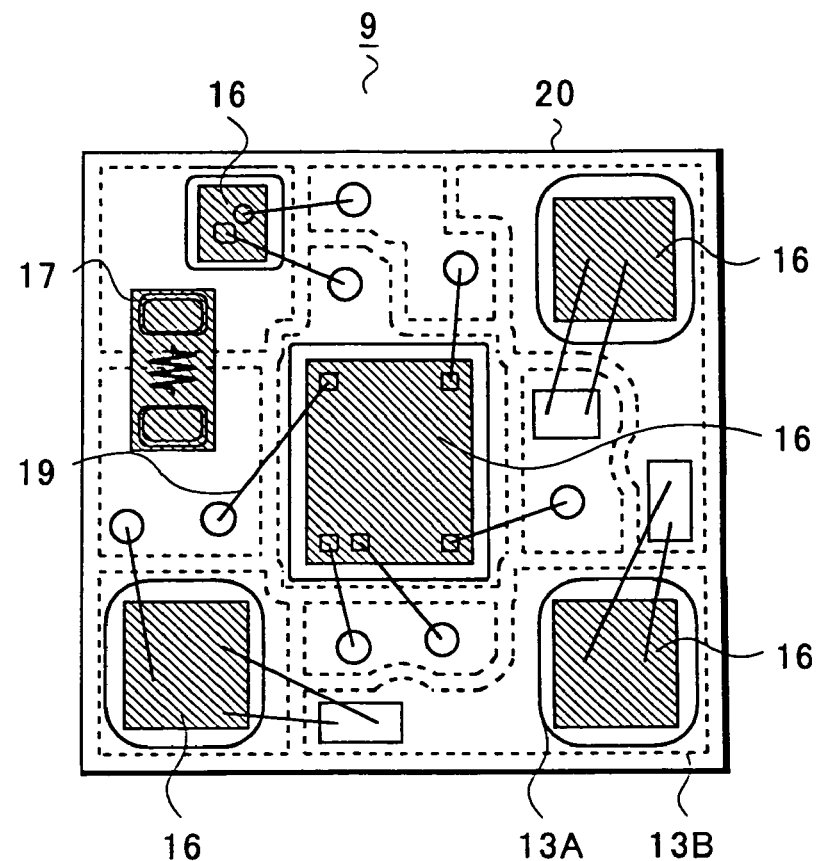
FIG. 8A is a plan view and FIG. 8B is a cross-sectional view for describing an example of a circuit device manufactured by a method of manufacturing a circuit device according to a third embodiment of the present invention.
Figure 8B:
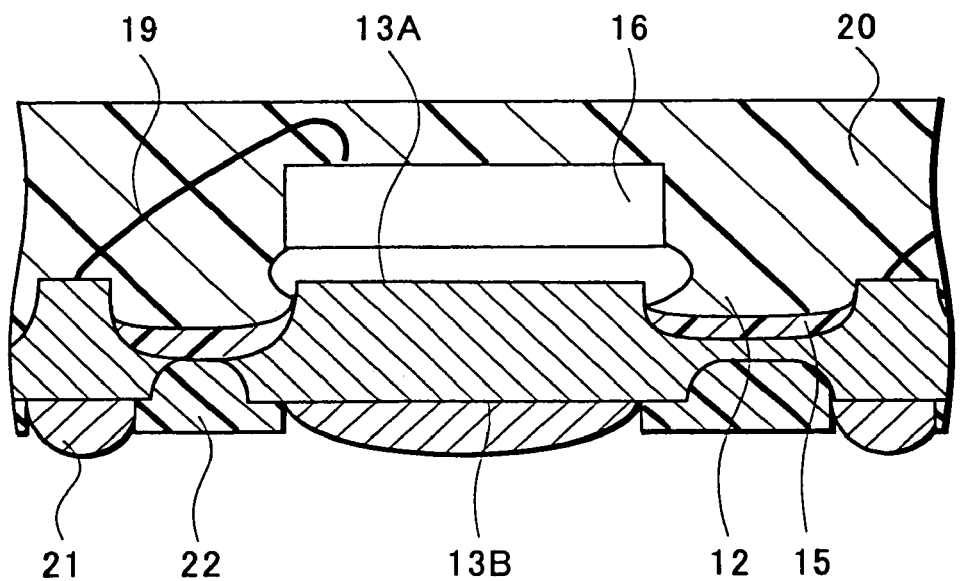

This embodiment will describe one example of the circuit device which can be manufactured by the above-described embodiments. FIG. 8A is a plan view of circuit device 9, and FIG. 8B is a cross-sectional view thereof. The circuit device 9 shown in these drawings embeds a plurality of circuit elements, and the respective circuit elements are electrically connected to one another through metal thin lines 19 or conductive patterns 13.

A planar shape of the conductive patterns 13 will be further described with reference to FIG. 8A. In this drawing, upper surfaces 13A of the conductive patterns are indicated by solid lines and lower surfaces 13B of the conductive patterns are indicated by dashed lines. Each upper surface 13A of the conductive pattern constitutes a die pad region where a circuit element is mounted and a bonding pad region where a metal thin line is connected. As described previously, the conductive patterns 13 in this specification have very high positional accuracy. Therefore, it is possible to prevent a short circuit between the conductive patterns 13 attributable to deviation of planar positions of the conductive patterns 13.

Semiconductor element 16 and chip element 17 are adopted as circuit elements. These circuit elements are fixed onto islands made of the conductive patterns 13.

Sealing resin 20 covers the circuit elements, the metal thin lines 19, and the conductive patterns 13 while exposing rear surfaces of the conductive patterns 13. As for the sealing resin 20, thermosetting resin or thermoplastic resin is generally applicable. Moreover, the sealing resin 20 is filled in isolation trenches 12 for isolating the respective conductive patterns 13. In addition, entire circuit device 10A of this embodiment is supported by the sealing resin 20.

In this embodiment, the upper surface 13A of the conductive pattern and the lower surface 13B of the conductive pattern can be formed into mutually different shapes. Therefore, it is possible to form a plurality of upper surfaces 13A of the conductive patterns on one of the conductive patterns 13. In this way, the circuit device 9 can incorporate more complicated electric circuits.

Fourth Embodiment

In this embodiment, a configuration of a circuit device having a multilayer wiring structure and a manufacturing method thereof will be described. In this embodiment as well, conductive patterns are exposed while omitting an exposure process using an exposure mask. Details of respective processes will be described below.

Figure 9A:
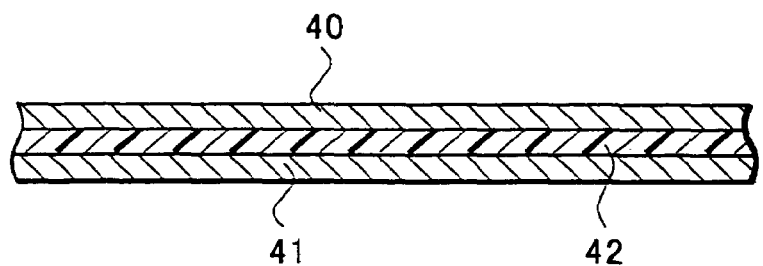
FIGS. 9A to 9D are cross-sectional views for describing a method of manufacturing a circuit device according to a fourth embodiment of the present invention.

As shown in FIG. 9A, a first process of this embodiment is intended to prepare an insulative resin sheet formed by attaching first conductive foil 40 and second conductive foil 41 to insulative resin 42.

The first conductive foil 40 is formed on substantially the entire area of a surface of the insulative resin sheet, while the second conductive foil 41 is formed on substantially the entire area of a rear surface of the insulative resin sheet. As for the material of the insulative resin 42, the insulative resin 42 is made of a polymer insulative material such as polyimide resin or epoxy resin. Meanwhile, the first conductive foil 40 and the second conductive foil 41 may be made of a material mainly containing Cu or a publicly known material for a lead frame. The conductive foils may be coated on the insulative resin 42 by a plating method, a vacuum deposition method or a sputtering method. Alternatively, metal foils made by a rolling method or a plating method may be attached thereto.

The insulative resin sheet may be also formed by a casting method. This manufacturing method will be briefly described below. Firstly, past polyimide resin is coated on the first conductive foil 40 in a flat film shape and also on the second conductive foil 41 in a flat film shape. Then, the polyimide resin on the both members is semi-hardened and the both members are attached together to finish the insulative resin sheet.

The insulative resin 42 may be made of polyimide resin, epoxy resin, and the like. In the case of the casting method for forming the sheet by coating the paste, the film thickness may be set in a range from about 10 μm to 100 μm. When forming the sheet, the minimum film thickness commercially available is equal to 25 μm. Filler may be blended in light of heat conductivity.

Figure 9B:
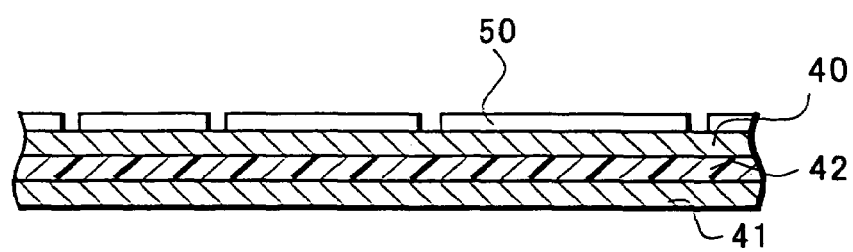
Figure 9C:
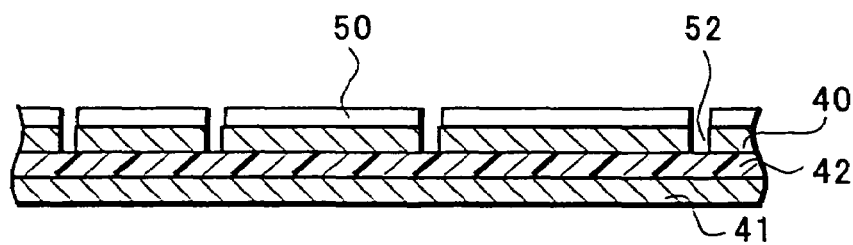

As shown in FIG. 9B and FIG. 9C, a second process of this embodiment is intended to form through holes 52 on the first conductive foil 40 and the insulative resin 42 in desired positions of the insulative resin sheet and to selectively expose the second conductive foil 41.

Firstly, as shown in FIG. 9B, resist 59 is entirely coated on a surface of the first conductive foil 40, and then the first conductive foil 40 is partially exposed by patterning. To be more precise, resist 50 is patterned so as to expose portions for electrically connecting the two conductive foils together.

Subsequently, as shown in FIG. 9C, the first conductive foil 40 is etched by use of this resist 50. Since the first conductive foil 40 is made of the material mainly containing Cu, chemical etching is performed by use of ferric chloride or cupric chloride as an etchant. Although the open diameter of the through hole 52 varies depending on resolution of photolithography, the open diameter ranges from about 50 to 100 μm in this case.

Figure 9D:
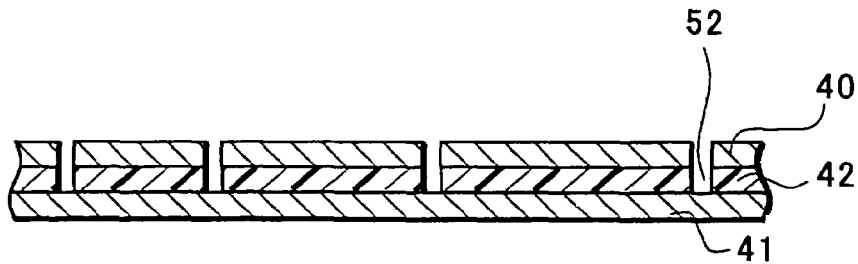

Next, as shown in FIG. 9D, after removing the resist 50, the insulative resin 42 immediately below the through holes 52 is removed with a laser while using the first conductive foil 40 as a mask, whereby the rear surface of the second conductive foil 41 is exposed at the bottom of each of the through holes 52. The laser used herein may be a carbon dioxide gas laser. If a residue remains at the bottom of the open portion after evaporating the insulative resin with the laser, this residue may be removed by wet etching with sodium permanganate, ammonium persulfate or the like.

Figure 10A:
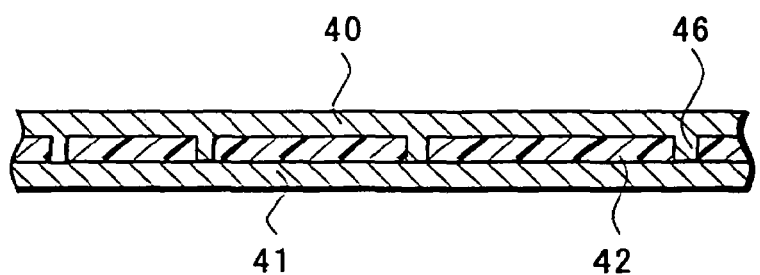
FIGS. 10A to 10D are more cross-sectional views for describing the method of manufacturing a circuit device according to the fourth embodiment of the present invention.

As shown in FIG. 10A, a third process of this embodiment is intended to form connecting portions 46 in the through holes 52 and to electrically connect the first conductive foil 40 to the second conductive foil 41.

A plated film serving as the connecting portions 46 for electrically connecting the second conductive foil 41 to the first conductive foil 41 is formed on the entire surface of the first conductive foil 41 including the through holes 52. This plated film is made by both of electroless plating and electrolytic plating. Here, Cu in a thickness of about 2 μm is at least formed on the entire surface of the first conductive foil 40 including the through holes 52 by electroless plating. In this way, the first conductive foil 40 is electrically connected to the second conductive foil 41. Accordingly, electrolytic plating is also performed while using the first conductive foil 40 and the second conductive foil 41 as electrodes. In this way, Cu is plated in a thickness of about 20 μm. In this way, Cu is buried in the through holes 52, thereby forming the connecting portions 46.

Figure 10B:
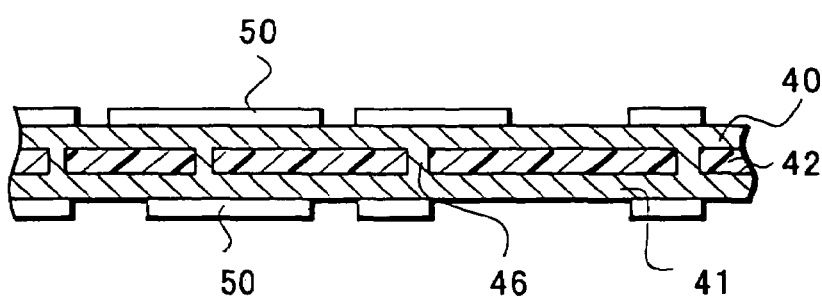
Figure 10C:
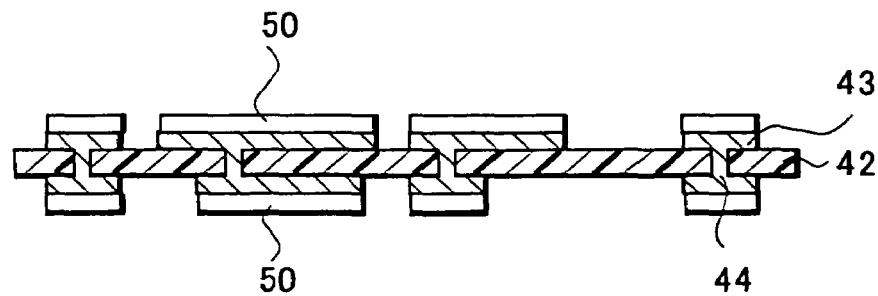
Figure 10D:
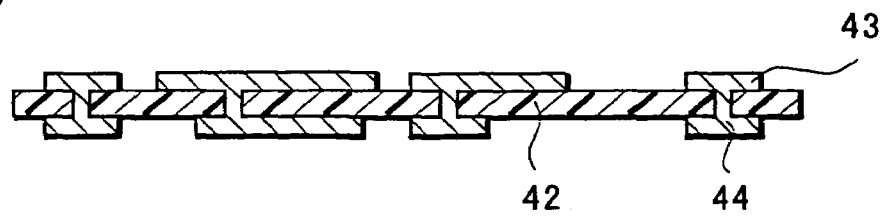

As shown in FIG. 10B to FIG. 10D, a fourth process of this embodiments is intended to etch the first conductive foil 40 and the second conductive foil 41 into desired patterns and thereby to form first conductive patterns 43 and second conductive patterns 44.

Surfaces of the first conductive foil 40 and the second conductive foil 41 are patterned by chemical etching while covering the surfaces with photoresist 50 formed into desired patterns. Since the conductive foils are made of the material mainly containing Cu, ferric chloride or cupric chloride may be used as an etchant.

Figure 11A:
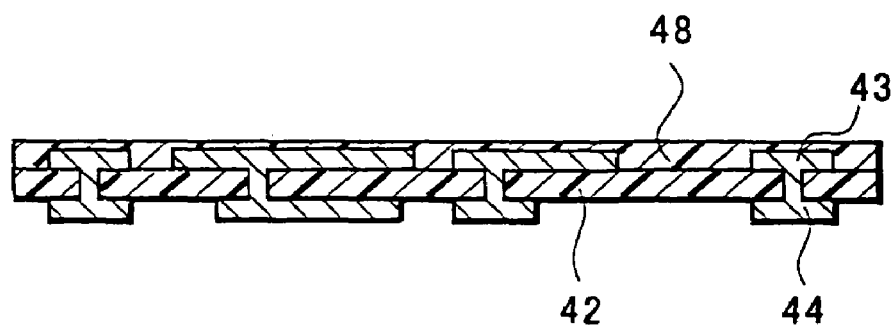
FIGS. 11A and 11B are more cross-sectional views for describing the method of manufacturing a circuit device according to the fourth embodiment of the present invention.
Figure 11B:
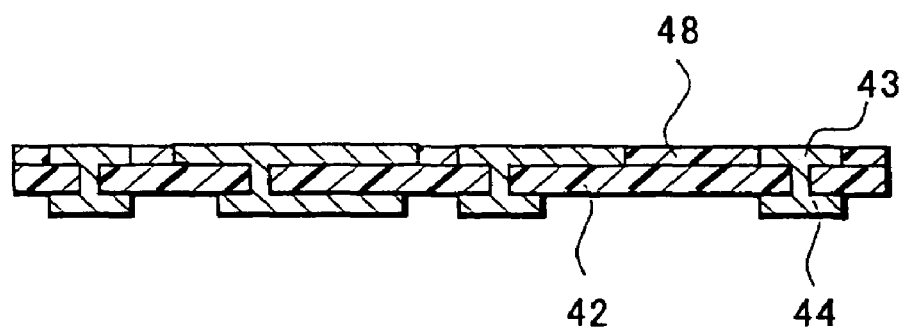

As shown in FIGS. 11A and 11B, a fifth process of this embodiment is intended to cover the first conductive patterns 43 with resin film 48 and then to expose the surfaces of the first conductive patterns 43 out of the resin film 48.

Firstly, as shown in FIG. 11A, the resin film 48 is formed so as to cover the first conductive patterns 43. This resin film 48 can be formed either by coating a liquefied resin film or by laminating sheet-shaped resin films. Formation of the resin film 48 by lamination can be achieved by a method similar to the method described with reference to FIGS. 2A to 2C. In this embodiment as well, the resin film 48 covering upper surfaces of the first conductive patterns 43 becomes thinner than the resin film 48 directly covering the insulative resin 42.

Next, as shown in FIG. 11B, the upper-surfaces of the first conductive patterns 43 are exposed by entirely etching a surface of the resin film 48. In this process, the resin film 48 is etching by a simplified method without using an exposure mask. Accordingly, it is possible to expose the upper surfaces of the patterns by the simplified method curtailing an exposure process. Moreover, since the method does not apply the exposure mask, it is possible to design the entire device while ignoring aligning accuracy of this mask. Therefore, it is possible to enhance patterning density. Here, in order to ensure exposure of the upper surfaces of the first conductive patterns 43, it is also possible to carry out etching of the resin film 48 until side surfaces of the first conductive patterns 43 are partially exposed.

Figure 12A:
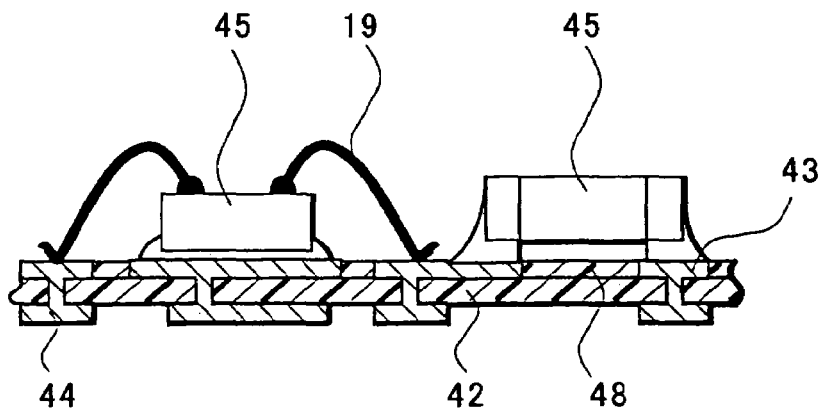
FIGS. 12A to 12C are more cross-sectional views for describing the method of manufacturing a circuit device according to the fourth embodiment of the present invention.
Figure 12B:
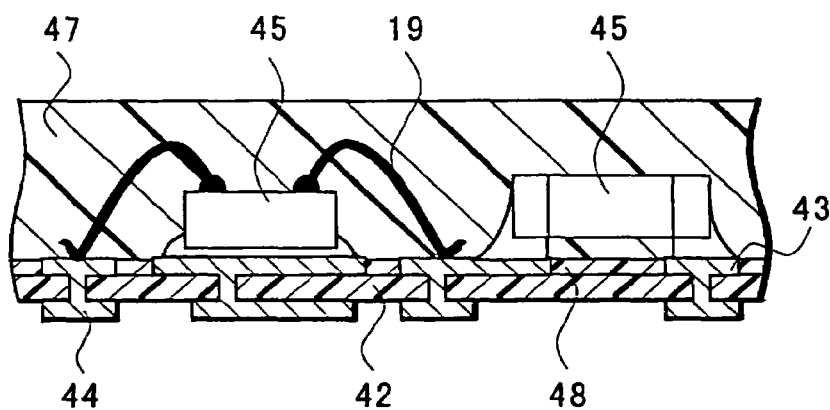
Figure 12C:
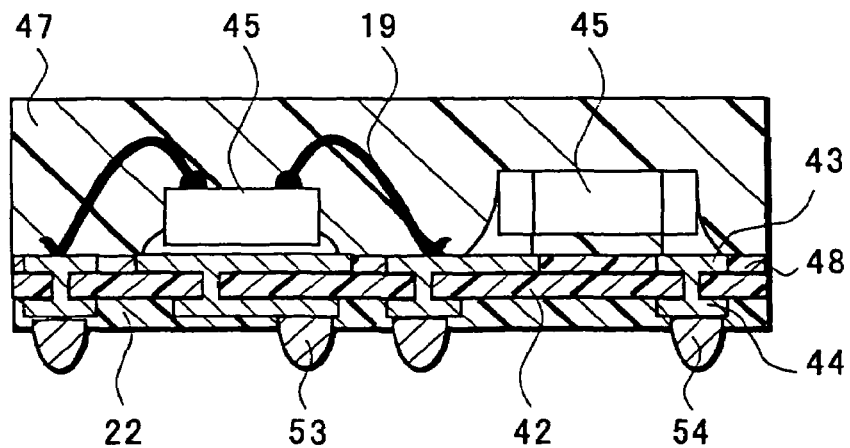

As shown in FIGS. 12A to 12C, a sixth process of this embodiment is intended to fix circuit elements 45 onto the surfaces of the first conductive patterns 43 and further to seal the circuit elements 45.

Firstly, as shown in FIG. 12A, the circuit elements 45 are fixed onto the first conductive patterns 43. Here, the circuit elements 45 are fixed onto the surface of the first conductive patterns 43, and then the circuit elements 45 are electrically connected by use of metal thin lines 19 when appropriate. Active elements and passive elements are generally applicable to the circuit elements 45.

Next, as shown in FIG. 12B, the circuit elements 45 and the metal thin lines 19 are covered and sealed with sealing resin 47. Moreover, as shown in FIG. 12C, the second conductive patterns 44 exposed out of a rear surface of the device are subjected to a rear-surface treatment. To be more precise, the rear surface except positions for forming external electrodes 53 is covered with covering resin 22. Then, the circuit device including the multilayer wiring is finished by forming the external electrodes 53.

What is claimed is:

1. A circuit device comprising:

conductive patterns;

a circuit element electrically connected to the conductive pattern;

a resin film formed between the conductive patterns and covering side surfaces of the conductive patterns;

an adhesive configured to fix the circuit element to the conductive patterns by contacting upper surfaces and the side surfaces of the conductive patterns; and sealing resin for sealing the circuit element.

2. The circuit device according to claim 1, wherein the adhesive is any of a conductive adhesive and an insulative adhesive.

3. The circuit device according to claim 1, wherein a side surface of the adhesive is formed into a smoothly curved surface.

4. The circuit device according to claim 1, wherein the conductive patterns comprise a multilayer wiring structure.

5. The circuit device according to claim 1, wherein the circuit element is a semiconductor element to be mounted with a flip chip.

* * * * *